United States Patent
Otsuki et al.

(10) Patent No.: US 8,210,241 B2
(45) Date of Patent: Jul. 3, 2012

(54) HEAT SINK FAN

(75) Inventors: Takaya Otsuki, Kyoto (JP); Takamasa Yamashita, Kyoto (JP)

(73) Assignee: Nidec Corporation, Kyoto (JP)

( * ) Notice: Subject to any disclaimer, the term of this patent is extended or adjusted under 35 U.S.C. 154(b) by 861 days.

(21) Appl. No.: 11/956,381

(22) Filed: Dec. 14, 2007

(65) Prior Publication Data

US 2008/0156461 A1    Jul. 3, 2008

(30) Foreign Application Priority Data

Dec. 28, 2006  (JP) ................. 2006-353789

(51) Int. Cl.
F28F 7/00 (2006.01)
F24H 3/02 (2006.01)

(52) U.S. Cl. ...................................... 165/80.3; 165/121

(58) Field of Classification Search ................ 165/80.3, 165/104.34, 121, 122; 361/695, 697, 719
See application file for complete search history.

(56) References Cited

U.S. PATENT DOCUMENTS

| | | | |
|---|---|---|---|
| 5,794,685 A | 8/1998 | Dean | |
| 6,419,007 B1 | 7/2002 | Ogawara et al. | |
| 6,498,724 B1 * | 12/2002 | Chien | 361/679.47 |
| 6,538,888 B1 * | 3/2003 | Wei et al. | 361/697 |
| 6,671,172 B2 | 12/2003 | Carter et al. | |
| 6,697,256 B1 * | 2/2004 | Horng et al. | 361/704 |
| 6,714,415 B1 | 3/2004 | Shah | |
| 6,722,418 B2 * | 4/2004 | Zhang | 165/80.3 |
| 6,779,593 B1 | 8/2004 | Hegde | |
| D509,484 S | 9/2005 | Mochizuki et al. | |
| D509,485 S | 9/2005 | Mochizuki et al. | |
| 7,020,020 B1 | 3/2006 | Lojek | |
| 7,123,483 B2 | 10/2006 | Otsuki et al. | |
| 7,188,418 B2 | 3/2007 | Shah | |
| D541,229 S | 4/2007 | Watanabe et al. | |
| 7,200,934 B2 | 4/2007 | Carter et al. | |
| 7,221,567 B2 | 5/2007 | Otsuki et al. | |
| 7,269,013 B2 | 9/2007 | Chen et al. | |
| 7,278,209 B2 | 10/2007 | Otsuki et al. | |

(Continued)

FOREIGN PATENT DOCUMENTS

JP            D1295760         3/2007

(Continued)

OTHER PUBLICATIONS

U.S. Appl. No. 29/249,552.

(Continued)

*Primary Examiner* — Tho V Duong
(74) *Attorney, Agent, or Firm* — Keating & Bennett, LLP

(57) ABSTRACT

An axial fan having a rotatable impeller is arranged above a heat sink with a rotation axis of the impeller substantially coincident with a center axis of a base portion of the heat sink. Radially outer ends of fins arranged on the outer peripheral surface of the base station define an envelope which is provided with a recess therein. The axial fan has a hosing including a surrounding portion surrounding the impeller and arms extending from the surrounding portion. Each arm is provided with an engagement portion engaging with the recess of the heat sink, so that the axial fan is secured to the heat sink. Each arm also has an attachment portion at its lower end. At the attachment portion, an assembly of the axial fan and the heat sink is attached to a motherboard with an object to be cooled mounted thereon.

11 Claims, 7 Drawing Sheets

U.S. PATENT DOCUMENTS

| | | | |
|---|---|---|---|
| 7,281,893 B2 * | 10/2007 | Pan | 415/177 |
| 7,359,200 B2 * | 4/2008 | Zhou et al. | 361/704 |
| 7,405,934 B2 * | 7/2008 | Otsuki et al. | 361/697 |
| 7,411,327 B2 * | 8/2008 | Watanabe et al. | 310/71 |
| 7,532,472 B2 * | 5/2009 | Lin et al. | 361/697 |
| 2002/0017378 A1 | 2/2002 | Hu | |
| 2002/0046826 A1 | 4/2002 | Kao | |
| 2002/0075649 A1 * | 6/2002 | Chou | 361/697 |
| 2005/0141193 A1 * | 6/2005 | Otsuki et al. | 361/695 |
| 2005/0225939 A1 * | 10/2005 | Otsuki et al. | 361/695 |
| 2005/0280992 A1 | 12/2005 | Carter et al. | |
| 2008/0030952 A1 * | 2/2008 | Chen et al. | 361/697 |

FOREIGN PATENT DOCUMENTS

| | | |
|---|---|---|
| JP | D1296655 | 3/2007 |
| TW | D118870 | 9/2007 |
| TW | D118879 | 9/2007 |
| TW | D118994 | 9/2007 |

OTHER PUBLICATIONS

U.S. Appl. No. 29/276,415.

U.S. Appl. No. 29/282,739.

* cited by examiner

HEAT SINK FAN

BACKGROUND OF THE INVENTION

1. Field of the Invention

The present invention relates to a heat sink fan for cooling an object such as an electronic component.

2. Description of the Related Art

MPUs (microprocessing units) are key components of computers which process data input thereto to obtain a result, and are mounted in high-performance electronic devices. Clock frequencies of MPUs have rapidly increased in recent years, and, along with this, the heat generation in MPUs has continued to increase. The heat generation in MPUs may increase possibilities of malfunction or failure thereof. Therefore, it is critical how efficiently the heat generated by MPUs is radiated.

Electronic components which are mounted on high-performance electronic devices and can generate heats, such as MPUs, are used with heat sink fans attached thereto. The heat sink fan is an assembly of a heat sink and an axial fan sending air to the heat sink. The heat sink includes a plurality of heat-dissipating fins which are arranged so as to increase the surface area of the heat sink. The heat sink is usually made of metal. The heat sink fan is attached to a heat-generating electronic component such as an MPU such that the heat generated in the MPU can be transferred to the heat sink. The heat transferred to the heat sink is forcedly radiated by air delivered by the axial fan.

MPUs are usually mounted on circuit boards called as "motherboards". Heat sink fans are also mounted on the motherboards to be in thermal contact with the MPUs. Therefore, each heat sink fan has to be provided with a mounting portion which allows the heat sink to be attached onto a mother board.

SUMMARY OF THE INVENTION

According to preferred embodiments of the present invention, a heat sink fan includes: a heat sink including a base portion centered on its center axis and a plurality of fins arranged on an outer peripheral surface of the base portion and extending outward from the base portion in a radial direction perpendicular to or substantially perpendicular to the center axis; and a fan arranged above and coaxial with the heat sink and including an impeller rotatable about the center axis to generate an axially downward air flow, a motor rotating the impeller, and a housing surrounding the impeller and supporting the motor, the impeller having a plurality of blades which are arranged about the center axis and extend outward in the radial direction. The housing includes a plurality of arms extending axially downward, at least one of the arms is provided with an engagement portion engaging with a portion of the heat sink to restrict axial movement of the heat sink.

An envelope of the heat sink formed as a virtual plane by connecting outer peripheral ends of the fins of the heat sink, may be provided with at least one of a projection projecting away from the center axis and a recess concave toward the center axis. The engagement portion of the housing of the fan engages with the at least one of the projection and the recess.

The engagement portion of the housing of the fan may engage with a lower end of at least one of the fins of the heat sink.

Each arm may include two supporting portions which are arranged in a circumferential direction of the heat sink.

A circumferential distance between the two supporting portions may decrease as the two supporting portions move axially downward.

Each arm may be provided with an attachment portion at which the heat sink fan is to be attached to another device, and the attachment portion is provided with a reinforcement wall which extends from a lower end of the arm upward and is cylindrical.

The arms may be regularly arranged about the center axis at four positions in a circumferential direction of the heat sink, the four positions including two opposing portions at each of which the engagement portion is provided.

The housing may further include: a substantially annular surrounding portion; a plurality of support posts extending axially upward from the surrounding portion; and a plurality of ribs connecting axially upper ends of the support posts and the motor to each other axially above the impeller.

The arms may extend downward from the surrounding portion. In this case, each support post is arranged between circumferentially adjacent two of the arms.

The housing may include a plurality of protrusions protruding downward from the surrounding portion. In this case, each protrusion is arranged between circumferentially adjacent two of the arms.

Each arm may include two axially extending supporting portions which are arranged in a circumferential direction of the heat sink. In this case, the supporting portions support the attachment portion therebetween.

The housing may further include a base supporting the motor. In this case, the surrounding portion, the support posts, the base, and the arms of the housing are formed by a single continuous member.

Other features, elements, advantages and characteristics of the present invention will become more apparent from the following detailed description of preferred embodiments thereof with reference to the attached drawings.

DETAILED DESCRIPTION OF PREFERRED EMBODIMENTS

Figure 1:
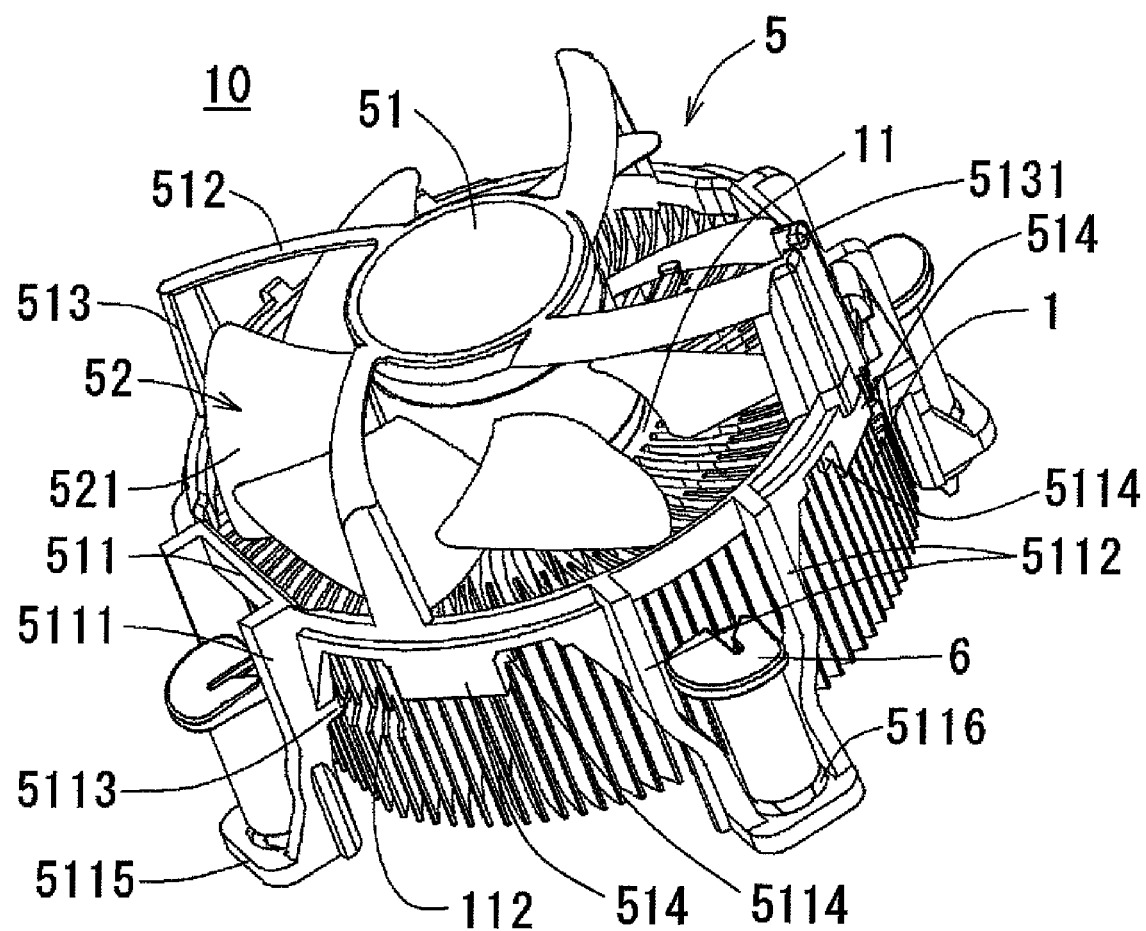
FIG. 1 is a perspective view of a heat sink fan according to a first preferred embodiment of the present invention.

Referring to FIGS. 1 through 7, preferred embodiments of the present invention will be described in detail. It should be noted that in the explanation of the present invention, when positional relationships among and orientations of the different components are described as being up/down or left/right, ultimately positional relationships and orientations that are in the drawings are indicated; positional relationships among and orientations of the components once having been assembled into an actual device are not indicated. Meanwhile, in the following description, an axial direction indicates a direction parallel to a rotation axis, and a radial direction indicates a direction perpendicular to the rotation axis.

First Preferred Embodiment

Figure 2:
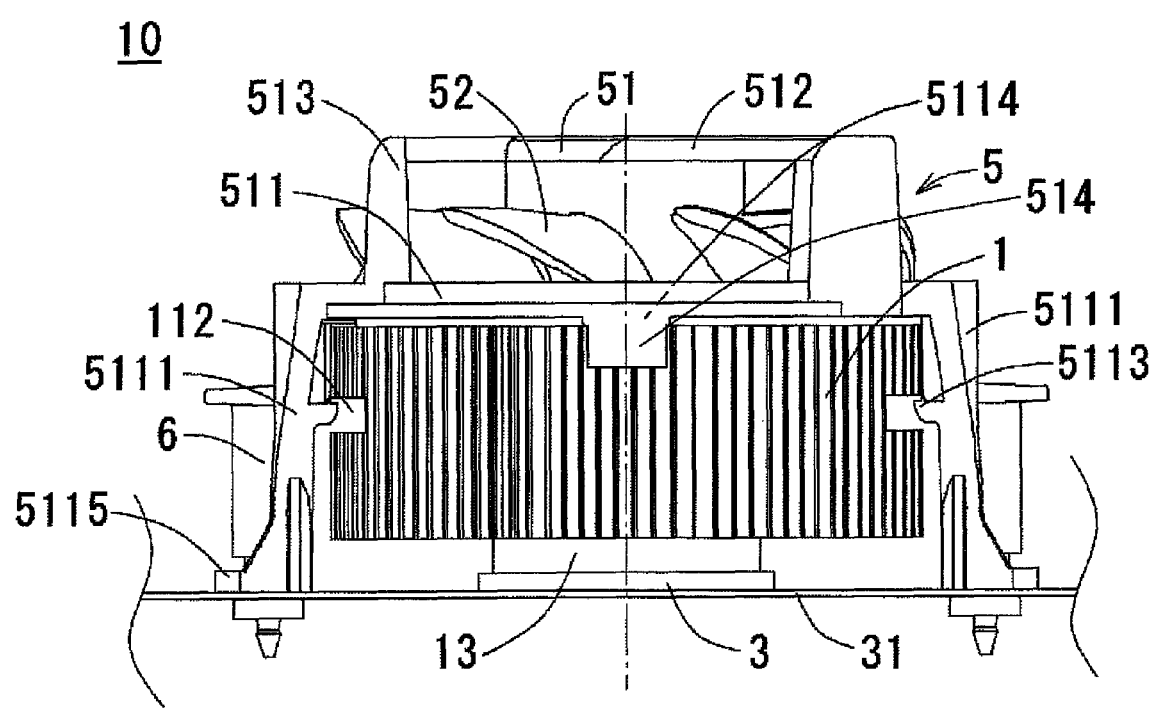
FIG. 2 is a side view of the heat sink fan of FIG. 1, showing a state where a heat sink thereof is in contact with an MPU.
Figure 3:
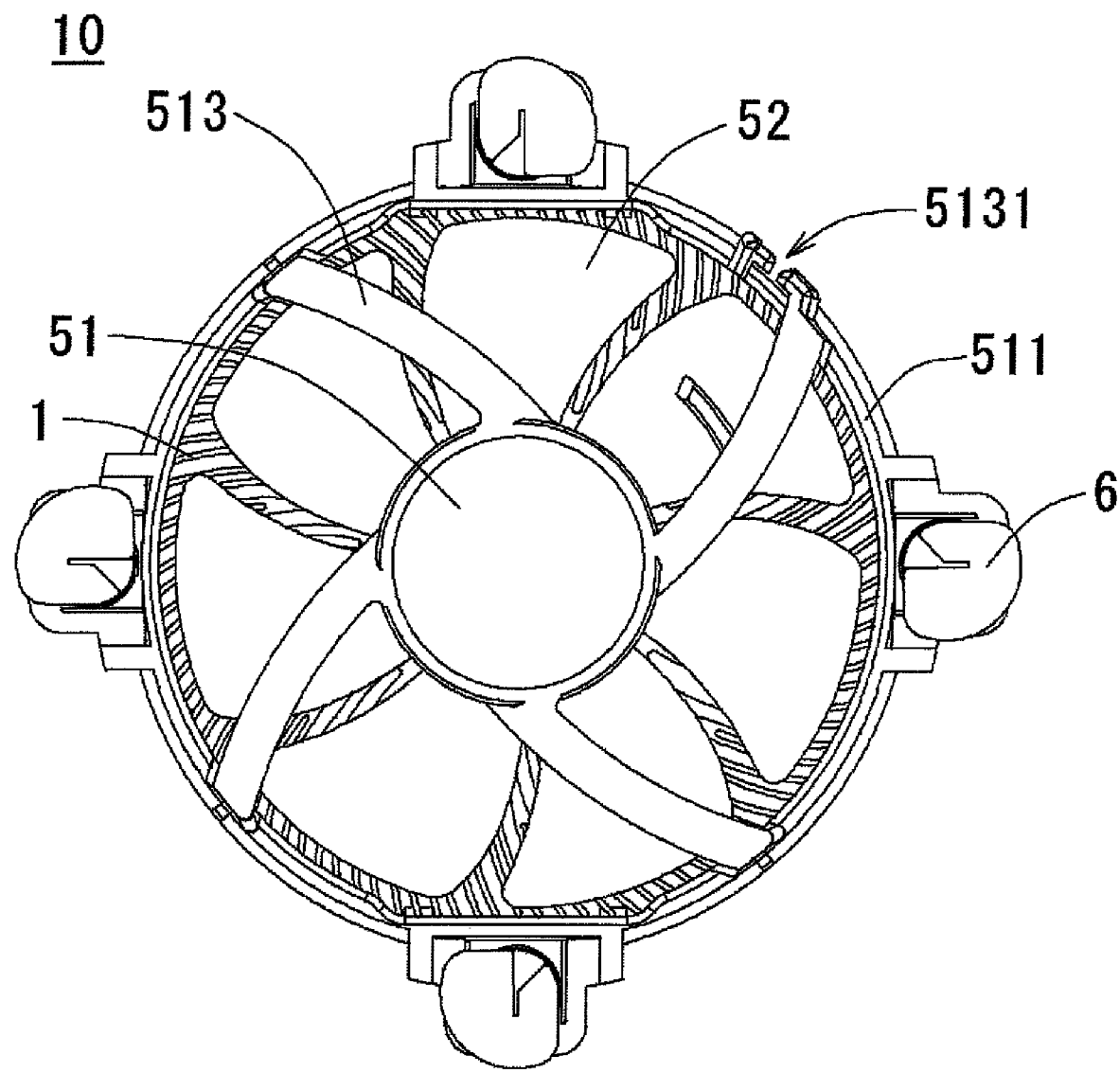
FIG. 3 is a top view of the heat sink fan according to the first preferred embodiment of the present invention.

FIG. 1 is a perspective view of a heat sink fan according to a first preferred embodiment of the present invention. FIG. 2 is a side view showing a state where a heat sink of the heat sink fan of FIG. 1 is in contact with and an MPU as an example of heat-generating electronic component. FIG. 3 is a top view of the heat sink fan of FIG. 1.

The heat sink 1 is a heat-dissipation member made of material having relatively high thermal conductivity. Examples of the material of the heat sink 1 are copper, copper aluminum, aluminum, and aluminum alloy. The heat sink 1 is formed by extrusion or drawing, for example. In this preferred embodiment, the heat sink 1 is made of aluminum alloy.

The heat sink 1 includes a base portion 11 in the form of a substantially circular column, for example, and a plurality of fins 12 which are arranged on the outer peripheral surface of the base portion 11 continuously and integrally with the base portion 11. With this configuration, a contact area between the heat sink 1 and air, i.e., the surface area of the heat sink 1 is enlarged. The shape of the base portion 11 is not limited to the circular column. For example, the base portion 11 may have a shape of a rectangular column. In this preferred embodiment, the fins 12 extends from the outer peripheral surface of the base portion 11 in a direction away from the base portion 11, i.e., extends outward in a radial direction perpendicular to the center axis of the base portion 11, and are arranged about the center axis of the base portion 11. Especially in order to increase the surface area of each fin 12, each fin 12 is formed to be curved, or be straight and inclined with respect to a line extending from an inner end of the fin 12 in the radial direction. With this shape, the surface area of each fin 12 can be made larger as compared with a fin which is not inclined or curved, i.e., a fin which extends straight in the radial direction. The shape of the fin 12 which can increase the surface area thereof is not limited thereto.

In this preferred embodiment, the base portion 11 is formed in a shape of a substantially circular column centered on its center axis. The base portion 11 has a through hole (not shown) centered on the center axis at its center. The through hole has a substantially circular cross section when cut along a plane perpendicular to the center axis of the base portion 11. To an inner peripheral surface of the base portion 11 which defines the center hole is fitted and fixed a core 13 (see FIG. 2) in the form of a substantially circular column. In this preferred embodiment, the core 13 is made of copper-based material. The shapes of the through hole of the base portion 11 and the core 13 are not limited to the above-described shapes. However, it is preferable that the core 13 be in the form of a substantially circular column because, with this shape, the core 13 can have a designed outer diameter, i.e., a designed diameter of its outer peripheral surface with high accuracy by being formed by means of a lathe, for example.

There is contact thermal resistance on the contact surface between the core 13 and the inner peripheral surface of the base portion 11 when a heat is transferred from the core 13 to the base portion 11. The contact thermal resistance is heat transfer resistance at the contact surface between two members. The value of contact thermal resistance is determined depending on the contact pressure, the contact area, the surface roughness of the contact surface, and the thermal conductivities and the surface hardness of the members which are in contact with each other, for example. Therefore, if the core 13 has the designed outer diameter (i.e., the diameter of its outer peripheral surface) with high accuracy and the through hole has the designed diameter with high accuracy, variations in the values of contact thermal resistance can be reduced and the contact pressure at the contact surface can be uniform throughout all regions on the contact surface. Thus, the value of contact thermal resistance between the core 13 and the inner peripheral surface of the base portion 11 is approximately uniform. This means that heat can be efficiently transferred from the core 13 to the base portion 11. For this reason, it is preferable in order to reduce the contact thermal resistance value between the base portion 11 and the core 13 that the core 13 be in the form of a substantially circular column.

In order to reduce the value of the contact thermal resistance between the core 13 and the base portion 11, the core 13 is press-fitted into the through hole defined by the inner peripheral surface of the base portion 11 with a high contact pressure. In this preferred embodiment, while the base portion 11 expands with heat at high temperatures, the core 13 is inserted into the through hole. The base portion 11 is then cooled with the core 13 in the through hole. The base portion 11 shrinks when cooled, thus fixing the core 13 to the inner peripheral surface of the base portion 11. That is, the base portion 11 and the core 13 are fixed to each other by so-called "shrink fit". Through the core 13 and the base portion 11 thus fitted, heat transferred from the MPU 3 to the core 13 is efficiently transferred to the base portion 11 and is finally radiated from the fins 12 to the ambient air. Alternatively, instead of the through hole, a recess may be formed in the base portion 11, to which the core 13 is press-fitted or shrink-fitted, for example.

In this preferred embodiment, the core 13 is fixed to the inner peripheral surface of the base portion 11 which defines the through hole by press fit. However, it is not always that the through hole of the base portion 11 is filled with the core 13. For example, the base portion 11 has a through hole into which no component is inserted.

Referring to FIG. 2, the MPU 3 is mounted on a motherboard 31. The bottom surface of the core 13 is arranged on the MPU 3 with a heat transfer member (not shown) interposed therebetween. Thus, heat generated in the MPU 3 is transferred to the core 13 through the heat transfer member. Therefore, a total of the contact thermal resistance value between the MPU 3 and the heat transfer member and that between the heat transfer member and the core 13 is very important. For example, if the flatness of a surface of each of the MPU 3 and the core 13 is 0 μm, the surface roughness thereof is 0 μm, and the contact pressure is high, then the contact thermal resistance is very small at each of the contact surfaces between the heat transfer member and the MPU 3 and between the core 13 and the heat transfer member. However, the flatness and the surface roughness will never be zero at the same time in practical. That is, without the heat transfer member, an unfilled space or air gap is formed between the MPU 3 and the core 13. Since air has a high heat insulating property, the contact thermal resistance between the MPU 3 and the core 13 is high when there is an air gap between them. In this preferred embodiment, however, the heat transfer member is arranged between the MPU 3 and the core 13. Therefore, the value of the total contact thermal resistance between the MPU 3 and the core 13 can be made smaller.

The heat transfer member is made of material having a high heat transfer capability. In this preferred embodiment, a tape-like member such as a thermal tape, in which a base such as a polyimide film or aluminum foil is coated with pressure-sensitive adhesive including filler, is used from a viewpoint of workability. Another example of the material of the heat transfer member is thermally conductive silicone in which silicone oil as base oil is blended with powders having high thermal conductivity such as alumina. The thermally conductive silicone is usually in the form of grease and therefore can come into close contact with the MPU 3 and the core 13 almost without air gaps. Thus, it is possible to effectively use the surface of the MPU 3 and the surface joined thereto for heat transfer. Any material can be used for the heat transfer member, as long as it is high in thermal conductivity. The shape and material of the heat transfer member cannot be specifically limited.

The heat generated in the MPU 3 is transferred to the core 13 of the heat sink 1 through the heat transfer member. If thermal resistance is reduced in this heat transfer process, the heat radiation performance of the heat sink fan can be largely improved. In this preferred embodiment, the thermal resistance is reduced by increasing the contact pressure between the core 13 and the MPU 3.

The heat transferred to the core 13 is then transferred to the base portion 11. There is a sufficient level of the contact pressure between the core 13 and the base portion 11 because the core 13 is press-fitted or shrink-fitted into the through hole in the base portion 11 in this preferred embodiment. Thus, the contact thermal resistance between the core 13 and the base portion 11 is small. If the contact thermal resistance needs to be further reduced between the core 13 and the base portion 11, a heat transfer member is arranged between the inner peripheral surface of the base portion 11 and the outer peripheral surface of the core 13, for example.

The heat transferred to the base portion 11 is then transferred to the fins 12. In this preferred embodiment, an axial fan 5 is arranged above the heat sink 1, as shown in FIG. 1, and sends air to the heat sink 1. Thus, the heat transferred to the fins 12 is forcedly radiated.

The structure of the axial fan 5 is now described. Referring to FIG. 1, the axial fan 5 includes an impeller 52 which generates an air flow when rotating about its rotation axis, a motor (not shown) which rotates the impeller 52, and a housing which accommodates the impeller 52 and the motor. The axial fan 5 is arranged with the rotation axis of the impeller 52 substantially coincident with the center axis of the base portion 11 of the heat sink 1. The housing includes a surrounding wall portion 511 which converts the air flow generated by rotation of the impeller 52 to static-pressure energy, a base portion 51 which fixes the motor thereto so as to fix the motor, and at least three ribs 512 connecting the base portion 51 to the surrounding wall portion 511. In this preferred embodiment, the surrounding wall portion 511 is substantially annular, i.e., continuous over its entire circumferential length, and there are provided four ribs 512. As shown in FIGS. 1 and 2, the surrounding wall portion 511 is provided with support posts 513 extending axially upward therefrom and arranged at a substantially regular interval. The number of the support posts 513 is the same as the ribs 512 and is four in this preferred embodiment. The upper end of each support post 513 is connected to a radially outer end of a corresponding one of the supporting ribs 512. Please note that the radial direction is a direction perpendicular to or substantially perpendicular to the rotation axis of the impeller 52. The base portion 51 is connected to the surrounding wall portion 511 with the ribs 512 and the support posts 513.

The impeller 52 includes a plurality of blades 521. The blades 521 are arranged about the rotation axis of the impeller 521 in a circumferential direction of the impeller 521. When the impeller 52 rotates, the blades 521 are turned about the rotation axis and provide kinetic energy to air and air is axially taken into and axially discharged. That is, rotation of the impeller 52 generates an axial air flow flowing from the upper side to the lower side in FIG. 2. The air flow has a centrifugal component directed outward in the radial direction, a swirling component directed along the circumferential direction, and an axial component directed in the axial direction. The air flow has the largest velocity in its radially outermost portion and the smallest velocity in its radially innermost portion. Since the air flow generated in the axial fan 5 of this preferred embodiment has the centrifugal component as described above, the air flow is directed outward in the radial direction. Therefore, the velocity of the air flow delivered to the heat sink 1 is the largest in the radially outermost portion of the fins 12.

As shown in FIG. 2, the axial fan 5 is arranged above the heat sink 1 with the rotation axis of the impeller 52 substantially coincident with the center axis of the base portion 11. The outer peripheral surface of the heat sink 1, i.e., a virtual surface formed by connecting the radially outer ends of the fins 12 to one another is provided with at least one recess 112 formed therein. This virtual surface is hereinafter referred to as an envelope of the fins 12. An engagement portion 5113, which is provided as a portion of each arm 5111 extending downward from the surrounding wall portion 511, engages with a cut portion of at least one of the fins 12 which defines a portion of the recess 112, so that the heat sink 1 and the axial fan 5 are fixed to each other. The details of the arm 5111 are described later.

The heat generated in the MPU 3 is transferred to the base portion 11 through the heat transfer member and the core 13, and is then transferred to the fins 12. The fins 12 are arranged about the center axis of the base portion 11, and an air flow generated by rotation of the axial fan 5 flows along the fins 12. Thus, the air flow efficiently flows spaces between the fins 12, so that the heat transferred to the fins 12 is forcedly radiated. In this manner, the cooling performance of the heat sink 1 can be largely improved by combining it with the axial fan 5.

The fins 12 are curved such that their radially outer ends are located on the upstream side of their radially inner ends in the rotation direction of the impeller 52. In the axial fan 5, trailing edges, i.e., heat-sink side edges of the blades 521 are curved such that their radially outer ends are located on the downstream side of their radially inner ends in the rotation direction of the impeller 52. Therefore, the trailing edges of the blades 521 are not parallel to the fins 12 when viewed along the axial direction. For this reason, it is possible to reduce noises caused by interference between an air flow generated by the turning blades 521 and the fins 12.

In this preferred embodiment, the fins 12 are curved such that their radially outer ends are located on the upstream side of their radially inner ends in the rotation direction of the impeller 52, as described above. However, the fins 12 may not be curved but be straight and inclined with respect to the radial direction. In this case, reduction of the noises caused by the interference of the air flow from the axial fan 5 with the fins 12 can be achieved to a certain degree. Moreover, even if the fins 12 extend straight in the radial direction, reduction of the interference noises can be achieved because the trailing edges of the blades 521 of the impeller 52 are curved such that their radially outer ends are located on the downstream side of their radially inner ends in the rotation direction of the impeller 52.

The shape of the arms 5111 of the surrounding wall portion 511 is now described in detail. Each arm 5111 includes two supporting portions 5112. Each supporting portion 5112 is provided with the engagement portion 5113 at the axially middle portion thereof which is to engage with the radially outer ends of the fin 12 defining the recess 112. The arms 5111 are circumferentially regularly arranged at, for example, four positions. The surrounding wall portion 511 is also provided with contact portions 5114 each projecting toward the heat sink 1, between the circumferentially adjacent arms 5111, as shown in FIG. 2. In this preferred embodiment, since the number of the arms 5111 is four, the number of the contact portions 5114 is four.

While the engagement portion 5113 engages with the radially outer end of at least one fin 12 which defines the recess 112, the top surface of the fins 12, which is formed by the upper ends of the fins 12, is in contact with the contact portions 5114 in the axial direction. The engagement portion 5113 applies an axially downward load to the heat sink 1 and the contact portions 5114 apply an axially upward load to the heat sink 1. The principle of leverage is used here, and the contact portions 5114 serve as fulcrums. Therefore, the loads applied to the heat sink 1 are determined by elasticity or elastic force of the surrounding wall portion 511.

As shown in FIGS. 1 and 2, amounting portion 5115 is provided at an axially lower end of each arm 5111 which is formed by two supporting portions 5112. The two supporting portions 5112 are connected to circumferentially spaced portions (e.g., portions near circumferential ends) of the mounting portion 5115. The mounting portion 5115 has a through hole 5116 substantially at the center thereof. Amounting member 6 is inserted into the through hole 5116. The mounting portion 5115 is attached to the motherboard 31 with the mounting member 6.

Referring to FIG. 2, the mounting member 6 runs through the motherboard 31 and the mounting portion 5115. If the mounting member 6 projects outwardly in the radial direction, it may interfere with another component mounted on the motherboard 31 and arranged around the heat sink fan 10, for example. Therefore, it is preferable to prevent or minimize radially outward projection of the mounting member 6. In order to achieve this, two supporting portions 5112 are arranged so as to allow the mounting member 6 to be inserted therebetween in this preferred embodiment. Assuming that each arm 5111 is formed by a single component, the mounting member 6 would be arranged radially outside the arm 5111. In this case, a bending moment is generated in the arm 5111 when an external force is applied to the arm 5111. That is, the arm 5111 cannot have the sufficient strength. On the other hand, the mounting member 6 or the mounting portion 5115 is sandwiched between two components of the arm 5111, i.e., two supporting portions 5112, the mounting member 6 or the mounting portion 5115 can be located at a radially closer position to the fins 12. In this manner, the outer diameter of the heat sink fan 10 can be reduced.

Moreover, since each arm 5111 is formed by two supporting portions 5112, air staying inside the arms 5111 can be discharged between the supporting portions 5112 radially outward. Thus, an air flow from the axial fan 5 can efficiently pass between the fins 12 and forcedly cool the MPU 3 without reducing the cooling efficiency of the heat sink fan 10.

The supporting portions 5112 of each arm 5111 are arranged such that a circumferential distance therebetween decreases as the supporting wall portions 5112 move axially downward, i.e., move away from the surrounding wall portion 511. More specifically, the two supporting portions 5112 extend from the surrounding wall portion 511 toward the mounting portion 5115 at angles with respect to the center axis. In other words, the supporting portions 5112 are inclined with respect to the axial direction. Thus, the two supporting portions 5112 and the surrounding wall portion 511 form together a truss. With this configuration, when a circumferential force is externally applied to the mounting portion 5115, compressive stress and tensile stress are generated in the two supporting portions 5112, instead of a bending moment, thereby providing high strength. Please note that the shape of the supporting portions 5112 maybe changed in an appropriate manner depending on the design but is not limited to the shape described above.

As shown in FIGS. 1 and 3, the arms 5111 and the support posts 513 are alternately arranged in the circumferential direction of the surrounding wall portion 511. In other words, each support post 513 is arranged between two circumferentially adjacent arms 5111. This arrangement of the arms 5111 and the support posts 513 makes the design of the mold or die for manufacturing the housing easier.

The mold or die for manufacturing the housing in this preferred embodiment is now described. In this preferred embodiment, the surrounding wall portion 511, the arms 5111, the base portion 51, the ribs 512, and the support posts 513 are formed by a single continuous member by injection molding using resin. The injection molding is usually carried out in the following manner. First, two mold pieces are prepared which define a closed space therebetween when coming into contact with each other. Molten resin is injected into the closed space, and thereafter the two mold pieces with the resin therein are forcedly or naturally cooled so that the resin is solidified. Then, the two mold pieces are separated from each other, thereby a molded product is removed from the molded pieces.

Thus, a product to be molded with only two mold pieces has to have such a shape that the mold pieces can be separated from each other without interfering with the molded product therein. In other words, the product to be molded must have no blind portion when viewed along a direction in which the mold pieces are separated from each other. The "blind portion" used here means a portion of the product which cannot be viewed from both sides in the direction of mold separation. If the product to be molded has a blind portion, it is impossible to separate the mold pieces from each other.

In this preferred embodiment, one of the support posts 513 is provided with a lead-wire hook 5131 which can catch a lead wire (not shown) supplying power to the motor. The lead-wire hook 5131 projects outward from the surrounding wall portion 511. Moreover, the mounting portion 5115 provided at the lower end of the arm 5111 also projects outward from the surrounding wall portion 511. Therefore, in a case where two mold pieces are separated in the same direction as the axial direction of the housing, if the arms 5111 and the support posts 513 are arranged at the same circumferential positions, a blind portion is formed between the lead-wire hook 5131 and the mounting portion 5115. In this case, an additional process for forming the blind portion, i.e., a so-called undercut process is required, increasing the number of processes for designing and fabricating the mold pieces. The additional process is a process to form the blind portion by using another mold piece called as a sliding core which is slidable in a direction different from the separation direction of the two mold pieces. In addition, the dimensional precision of the molded product may be lowered in this case. However, since the arms 5111 and the support posts 513 are arranged at different circumferential positions in this preferred embodiment, no additional process is required. Therefore, injection molding can be performed more easily.

In this preferred embodiment, the surrounding wall portion 511 further includes protrusions 514 at the same circumferential positions as the support posts 513. However, the protrusions 514 are provided on the side of the surrounding wall portion 511 opposite to the support posts 513 and protrude downward from the surrounding wall portion 511, as shown in FIG. 1. In this preferred embodiment, since four support posts 513 are provided, four protrusions 514 are provided. The protrusions 514 are arranged radially outside the fins 12 so as to be in contact therewith or with a small gap therebetween. Thus, even if the surrounding wall portion 511 tries to move in the radial direction relative to the heat sink 1, such radial movement is restricted by the protrusions 514.

Figure 4:
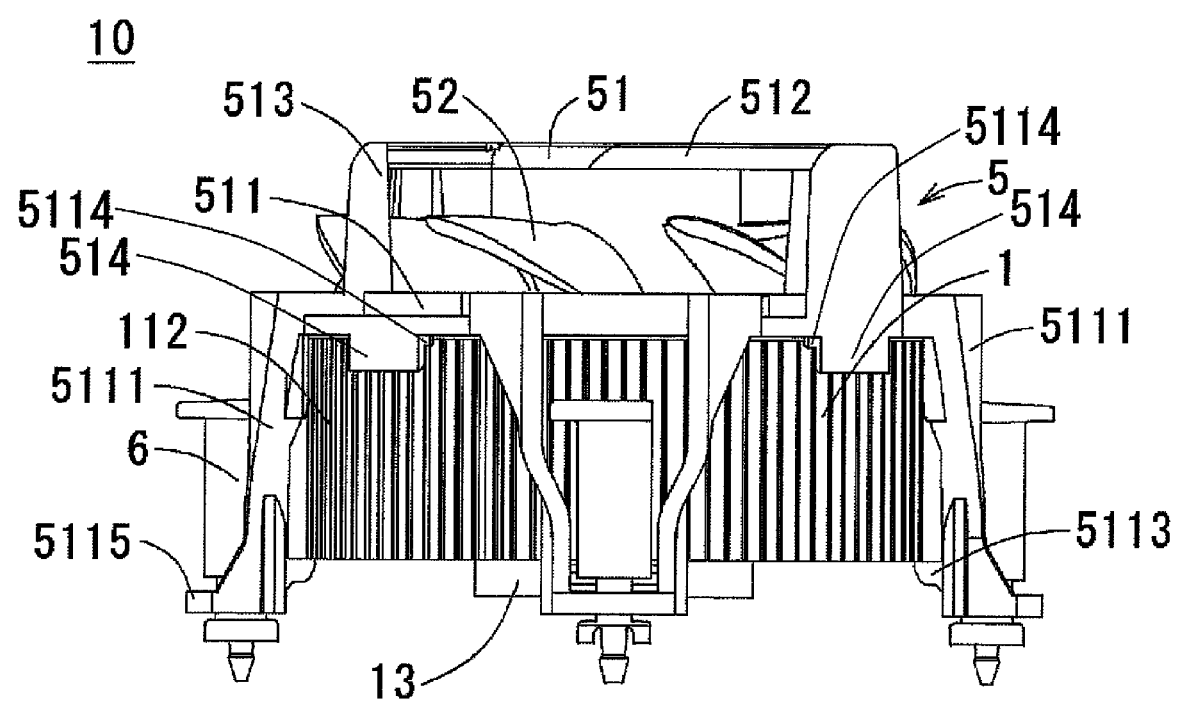
FIG. 4 is a side view of a heat sink fan according to a variant of the first preferred embodiment of the present invention.

FIG. 4 is a plan view of another exemplary heat sink fan according to the first preferred embodiment. In the example of FIGS. 1 to 3, the recess 112 is provided in the envelope of the fins 12 of the heat sink 1 and the engagement portion 5113 of the arm 5111 engages with the outer peripheral end of at least one fin 12 defining the recess 112 so as to secure the heat sink 1 and the axial fan 5 to each other. However, in the example of FIG. 4, the recess 112 is not provided in the envelope of the fins 12. Instead, the engagement portion 5113 is provided at or near the lower end of the arm 5111. The engagement portion 5113 of the arm 5111 engages with the lower end of at least one fin 12.

As described above, the axial position at which the engagement portion 5113 engages with at least one of the fins 12 is not specifically limited, as long as the axial fan 5 can be secured to the heat sink 1 by engagement. If the heat sink does not require any recess 112, the number of processes can be reduced, thus reducing the unit price of the heat sink 1.

The heat sink fan 10 of this preferred embodiment can be secured to the motherboard 31 by mounting the mounting member 6 at the mounting portion 5115. Moreover, the heat sink 1 and the axial fan 5 can be secured to each other by engagement of the engagement portion 112 of the arm 5111 with a portion of the fins 12. Therefore, in the heat sink fan 10 of this preferred embodiment, it is possible to secure the axial fan 5 to the heat sink 1 without using a separate component or part for attaching them to each other, unlike a conventional heat sink requiring a separate component or part for attachment. For this reason, the material cost and attachment const of the separate component for attachment can be cut, resulting in an inexpensive heat sink 10.

Second Preferred Embodiment

Figure 5:
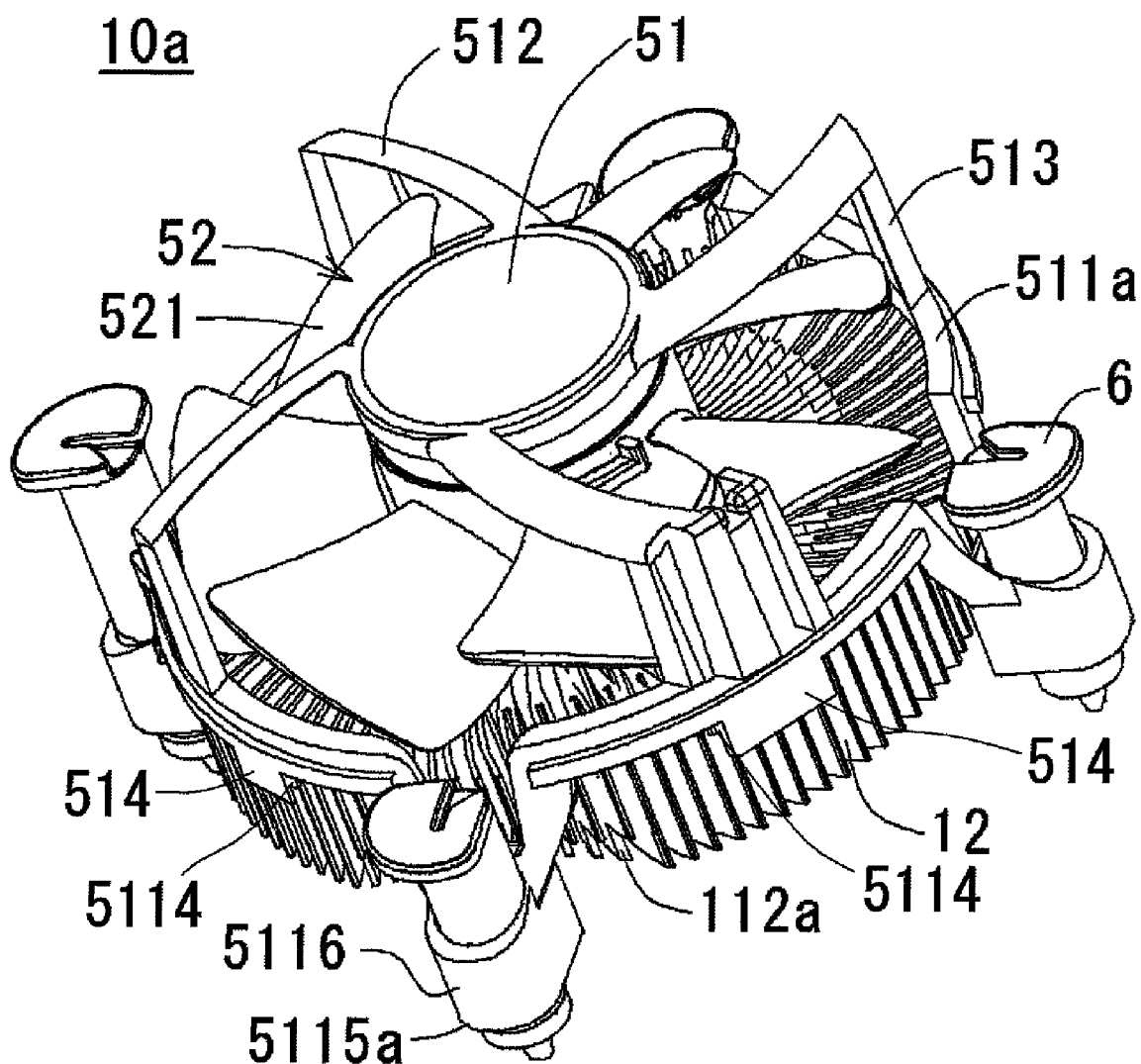
FIG. 5 is a perspective view of a heat sink fan according to a second preferred embodiment of the present invention.
Figure 6:
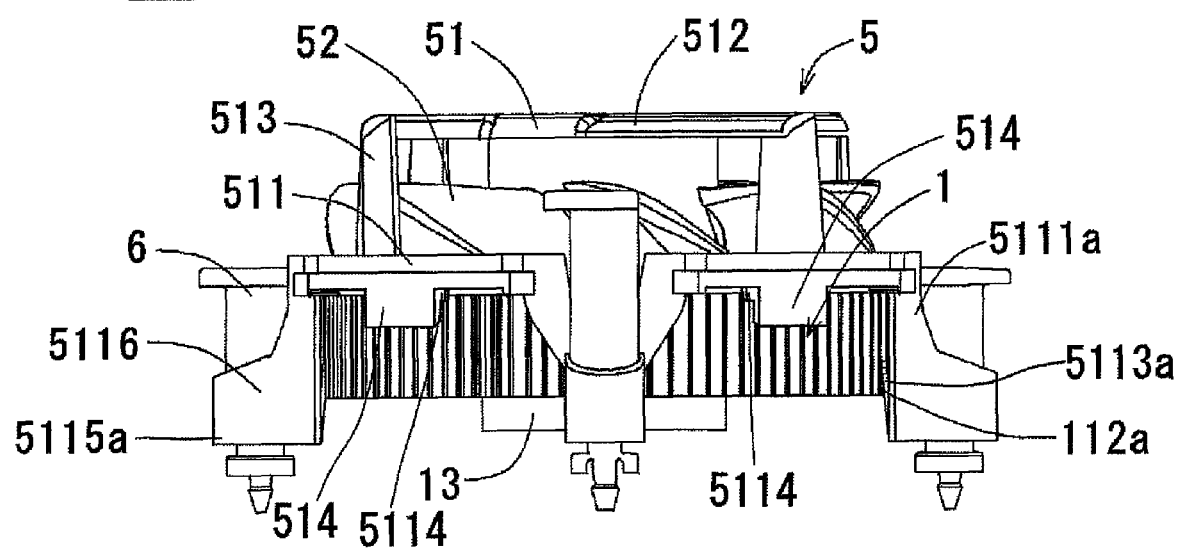
FIG. 6 is a side view of the heat sink fan of FIG. 5.
Figure 7:
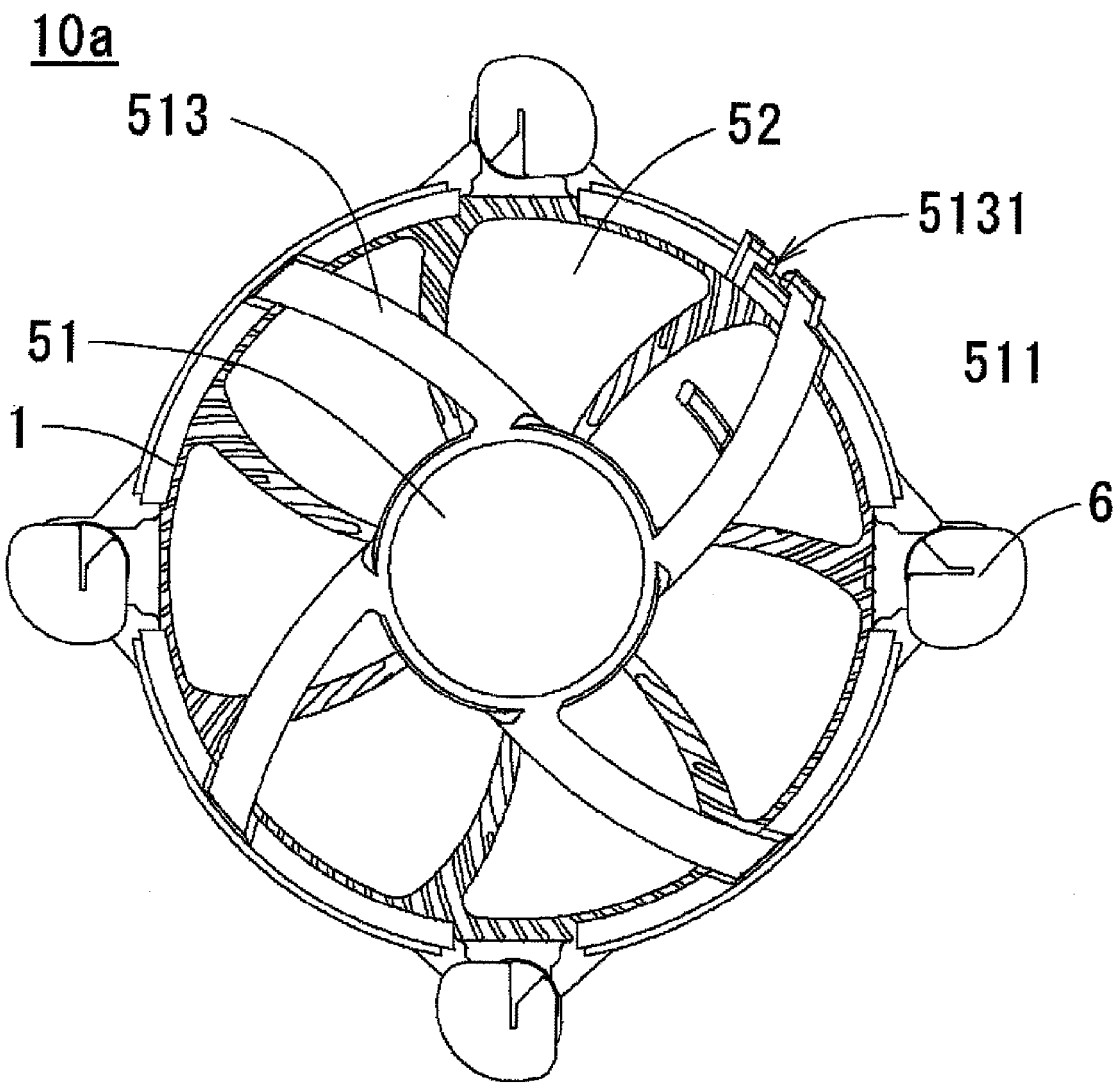
FIG. 7 is a top view of the heat sink fan of FIG. 5.

A heat sink fan according to a second preferred embodiment of the present invention is now described. FIG. 5 is a perspective view of the heat sink fan of this preferred embodiment. FIGS. 6 and 7 are side view and plan view of the heat sink fan of FIG. 5 when viewed from the radially outside and axially above. As shown in FIG. 5, the heat sink fan 10a is the same as the heat sink fan 10 of FIG. 1 except for the shape of the recess formed on the outer periphery of the heat sink, the shape of the arms, the shape of the mounting portion, and the shape of the heat sink. Therefore, like components are labeled with like reference numerals and the detailed description thereof is omitted.

As shown in FIG. 5, a surrounding wall portion 511a of the housing is provided with arms 5111a as in the first preferred embodiment. In this preferred embodiment, four arms 5111a are provided. However, the surrounding wall portion 511a is not annular. Although each arm 5111a is formed by two supporting portions 5112a circumferentially arranged as in the first preferred embodiment, the surrounding wall portion 511a is unconnected between the supporting portions 5112a.

The height, i.e., axial length of the heat sink fan 10a of the second preferred embodiment is lower than the heat sink 10 of the first preferred embodiment. Therefore, the length of the arms 5111a of the heat sink 1a of the second preferred embodiment is shorter than that of the heat sink 1 of the first preferred embodiment. Each arm 5111a is provided with a mounting portion 5115a at its axially lower end. The same mounting member 6 as that in the first preferred embodiment is put in the mounting portion 5115a. When the mounting member 6 is attached, an upper portion of the mounting member 6 is located on a line extending straight from the surrounding wall portion 511a, as shown in FIG. 7. This means, if the surrounding wall portion 511a were continuous over its entire circumferential length, the surrounding wall portion 511a would interfere with the mounting member 6. For this reason, the surrounding wall portion 511a is configured so as not to interfere with the mounting member 6 in this preferred embodiment.

In order to improve the cooling efficiency of the heat sink fan, the contact pressure between the core 13 of the heat sink 1 and the MPU 3 must be increased, as described above. This requires the mounting strength between the motherboard 31 and the mounting portion 5115a to be increased, thereby increasing the contact pressure. However, the mounting portion 5115a or the arm 5111a may be damaged when the mounting strength between the motherboard 31 and the mounting portion 5115a is increased. In order to prevent this, a reinforcement wall 5116 is provided around the mounting portion 5115a. With this configuration, stress applied to the mounting portion 5115a is distributed into the reinforcement wall 5116 and therefore the strength against an externally applied load is enhanced.

It is now assumed that the reinforcement wall 5116 is not provided. In this case, a through hole (not shown) is formed through the mounting portion 5115a in the form of a flat plate and the mounting member 6 is inserted into the through hole. Since the mounting portion 5115a in the form of a flat plate has small geometrical moment of inertia, it may be broken when stress is applied. However, if the reinforcement wall 5116 is provided, the geometrical moment of inertia of the mounting portion 5115a can be largely increased, resulting in large increase in the strength of the mounting portion 5115a. Moreover, in this preferred embodiment, the reinforcement wall 5116 covers connections between the supporting portions 5112a and the mounting portion 5115a. Thus, the cross-sectional area of the connection between the supporting portions 5112a and the mounting portion 5115a is increased and therefore the geometrical moment of inertia is largely increased. Consequently, the mounting strength between the supporting portions 5112a and the mounting portion 5115a is also increased. The reinforcement wall 5116 can be applied not only to this preferred embodiment but also to the first preferred embodiment.

In this preferred embodiment, the engagement portion 5113a formed as a portion of the arm 5115a is arranged on a radially inner surface of the reinforcement wall 5116. Also, a recess 112a provided on the envelope of the fins 12 is arranged at a position corresponding to the engagement portion 5113a.

In the above preferred embodiments, a portion of the fins 12 which is to engage with the engagement portion of the arm is the recess formed in the envelope of the fins 12. However, instead of the recess, at least one projection may be formed to engage with the engagement portion of the arm.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A heat sink fan comprising:
    a heat sink including a base portion centered on its center axis and a plurality of fins arranged on an outer peripheral surface of the base portion and extending outward from the base portion in a radial direction perpendicular to or substantially perpendicular to the center axis;
    a fan arranged above and coaxial with the heat sink and including an impeller rotatable about the center axis to generate an axially downward air flow, a motor rotating the impeller, and a housing surrounding the impeller and supporting the motor, the impeller including a plurality of blades which are arranged about the center axis and extend outward in the radial direction, wherein
    the housing includes:
        a substantially annular surrounding portion;
        a plurality of support posts extending axially upward from the surrounding portion;
        a plurality of protrusions protruding downward from the surrounding portion, at least one of the plurality of protrusions being arranged directly under at least one of the plurality of support posts such that a portion of the at least one of the plurality of protrusions is provided at a same circumferential position of the surrounding portion as the at least one of the plurality of support posts; and
        a plurality of arms extending axially downward, the plurality of arms being provided with a plurality of engagement portions arranged to engage with the heat sink to restrict axial movement of the heat sink;
    at least one of the plurality of arms includes an attachment portion with a mounting member arranged to attach the heat sink fan to another device, an axially uppermost portion of the mounting member being higher than an axially uppermost portion of the heat sink; and
    the plurality of fins include a plurality of recesses arranged on lower surfaces of the plurality of fins and arranged to engage with the engagement portions.

2. The heat sink fan according to claim 1, wherein an envelope of the heat sink formed as a virtual plane by connecting outer peripheral ends of the plurality of fins of the heat sink is provided and the plurality of recesses are concave toward the center axis.

3. The heat sink fan according to claim 1, wherein each of the plurality of arms includes two supporting portions which are arranged in a circumferential direction of the heat sink.

4. The heat sink fan according to claim 3, wherein a circumferential distance between the two supporting portions is wider at an upper end of the two supporting portions and is narrower at a lower end of the two supporting portions.

5. The heat sink fan according to claim 1, wherein each of the plurality of arms is provided with the attachment portion, and each attachment portion is provided with a reinforcement wall which extends from a lower end of the respective arm upward and is cylindrical.

6. The heat sink fan according to claim 1, wherein the plurality of arms are regularly arranged about the center axis at four positions in a circumferential direction of the heat sink, the four positions including two opposing portions at each of which the engagement portions are provided.

7. The heat sink fan according to claim 1, wherein the plurality of arms extend downward from the surrounding portion, and
    each of the plurality of support posts is arranged between circumferentially adjacent two of the arms.

8. The heat sink fan according to claim 5, wherein each of the plurality of arms includes two axially extending supporting portions which are arranged in a circumferential direction of the heat sink, and
    the two axially extending supporting portions support the attachment portion therebetween.

9. The heat sink fan according to claim 1, wherein the housing further includes a base supporting the motor, and
    the surrounding portion, the plurality of support posts, the base, and the plurality of arms of the housing are defined by a single continuous member.

10. The heat sink fan according to claim 1, wherein
    the axially uppermost portion of the mounting member is higher than an axially lowermost portion of the substantially annular surrounding portion and lower than an axially uppermost portion of the substantially annular surrounding portion.

11. The heat sink fan according to claim 1, wherein a portion of the mounting member is arranged at substantially the same axial height as an axially upper surface of the substantially annular surrounding portion.

* * * * *